(12) United States Patent
Jung et al.

(10) Patent No.: US 10,520,762 B2
(45) Date of Patent: Dec. 31, 2019

(54) DISPLAY DEVICE AND METHOD OF MANUFACTURING THE SAME

(71) Applicant: SAMSUNG DISPLAY CO., LTD., Yongin-si, Gyeonggi-do (KR)

(72) Inventors: Kyu Bong Jung, Yongin-si (KR); Min Soo Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/787,005

(22) Filed: Oct. 18, 2017

(65) Prior Publication Data

US 2018/0196300 A1    Jul. 12, 2018

(30) Foreign Application Priority Data

Jan. 11, 2017  (KR) ...................... 10-2017-00004278

(51) Int. Cl.
| | | |
|---|---|---|
| *G02F 1/1333* | (2006.01) | |
| *F21V 8/00* | (2006.01) | |
| *H01L 51/52* | (2006.01) | |
| *H05K 1/02* | (2006.01) | |

(52) U.S. Cl.
CPC ..... *G02F 1/133308* (2013.01); *G02B 6/0001* (2013.01); *H01L 51/5237* (2013.01); *H05K 1/0277* (2013.01)

(58) Field of Classification Search
CPC .......... G02F 1/133308; G02F 1/13452; G02F 2001/133314; G02F 2001/133322; G02F 2201/503; G02B 6/0001; H01L 51/5237; H01L 51/5246; H01L 51/0096; H05K 1/0277; G06F 1/1637
See application file for complete search history.

(56) References Cited

U.S. PATENT DOCUMENTS

| | | | | |
|---|---|---|---|---|
| 5,442,470 | A | * 8/1995 | Hashimoto | ....... G02F 1/133308 |
| | | | | 349/149 |
| 9,287,329 | B1 | 3/2016 | Lee et al. | |
| 9,846,335 | B2 | * 12/2017 | Bae | ........................ G02F 1/1339 |
| 9,971,215 | B2 | * 5/2018 | Hara | ..................... G02F 1/1345 |
| 2005/0241758 | A1 | 11/2005 | Kim et al. | |

(Continued)

FOREIGN PATENT DOCUMENTS

| | | | |
|---|---|---|---|
| JP | 2008170691 A | * | 7/2008 |
| KR | 10-2013-0015230 A | | 2/2013 |
| KR | 10-2014-0108827 A | | 9/2014 |

OTHER PUBLICATIONS

Search Report dated May 18, 2018 issued by the EPO for European patent application No. 17208844.5.

*Primary Examiner* — Hoan C Nguyen
(74) *Attorney, Agent, or Firm* — Kile Park Reed & Houtteman PLLC

(57) ABSTRACT

A display device and a method of manufacturing the same, the device including a support panel including a body and a guide, the guide being on one side of the body; a protective cap spaced apart from the guide at one side of the support panel; a first substrate on the support panel; and a flexible printed circuit board on one side of the first substrate, wherein an accommodation space is defined between the protective cap and the guide, and the flexible printed circuit board is accommodated in the accommodation space.

8 Claims, 9 Drawing Sheets

(56) References Cited

U.S. PATENT DOCUMENTS

| | | | |
|---|---|---|---|
| 2014/0217382 A1* | 8/2014 | Kwon | H01L 51/0097 257/40 |
| 2014/0268595 A1* | 9/2014 | Eom | H05K 1/028 361/749 |
| 2014/0307396 A1 | 10/2014 | Lee | |
| 2015/0253613 A1 | 9/2015 | Yoon et al. | |
| 2016/0179229 A1 | 6/2016 | Ahn | |
| 2016/0363795 A1 | 12/2016 | Jeon et al. | |

* cited by examiner

DISPLAY DEVICE AND METHOD OF MANUFACTURING THE SAME

CROSS-REFERENCE TO RELATED APPLICATION

Korean Patent Application No. 10-2017-0004278, filed on Jan. 11, 2017, in the Korean Intellectual Property Office, and entitled: "Display Device and Method of Manufacturing the Same," is incorporated by reference herein in its entirety.

BACKGROUND

1. Field

Embodiments relate to a display device and a method of manufacturing the same.

2. Description of the Related Art

Display devices are becoming increasingly important along with the development of multimedia. In response thereto, various types of display devices such as a liquid crystal display (LCD), an organic light emitting display (OLED) and the like have been used.

Recently, mobile electronic devices have been widely used. Examples of mobile electronic devices include tablet personal computers (PCs), in addition to small electronic devices such as mobile phones.

SUMMARY

The embodiments may be realized by providing a display device including a support panel including a body and a guide, the guide being on one side of the body; a protective cap spaced apart from the guide at one side of the support panel; a first substrate on the support panel; and a flexible printed circuit board on one side of the first substrate, wherein an accommodation space is defined between the protective cap and the guide, and the flexible printed circuit board is accommodated in the accommodation space.

The flexible printed circuit board may include a bending area that is bent, and the bending area may be accommodated in the accommodation space.

The display device may further include a driving chip on the flexible printed circuit board.

An end of the protective cap may cover the driving chip.

A central portion of the bending area may be spaced apart from the protective cap and the guide.

The guide may include a protruding curved surface, and the protective cap may include a recessed curved surface corresponding to the protruding curved surface.

A cross-section of the accommodation space may have a laterally lying "U" shape.

The display device may further include a protective film on an outside of the flexible printed circuit board.

One end of the accommodation space may be an open end and another end of the accommodation space may be a closed end.

The display device may further include a cover that covers the open end of the accommodation space.

A thickness of the guide may be greater than a thickness of the body.

The embodiments may be realized by providing a display device including a support panel including a body and a guide, the guide being on one side of the body; a protective cap spaced apart from the guide at one side of the support panel; and a first substrate on the support panel, the first substrate including a bending area that is bent at one side, wherein an accommodation space is defined between the protective cap and the guide, and the bending area is accommodated in the accommodation space.

The display device may further include a driving chip on the first substrate.

A central portion of the bending area may be spaced apart from the protective cap and the guide.

The guide may include a protruding curved surface, and the protective cap may include a recessed curved surface corresponding to the protruding curved surface.

A thickness of the guide may be greater than a thickness of the body.

The embodiments may be realized by providing a method of manufacturing a display device, the method including providing a support panel such that the support panel includes a body and a guide, the guide being on one side of the body; providing a protective cap such that the protective cap faces the guide; and seating a first substrate on the support panel, the first substrate having a flexible printed circuit board at one side thereof, wherein seating the first substrate on the support panel includes inserting the flexible printed circuit board in a bent state into an accommodation space between the guide and the protective cap.

The flexible printed circuit board may include a bending area that is bent, and inserting the flexible printed circuit board may include inserting the bending area into the accommodation space.

Inserting the flexible printed circuit board in a bent state into the accommodation space may include sliding and inserting the flexible printed circuit board along a lengthwise direction of the accommodation space.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
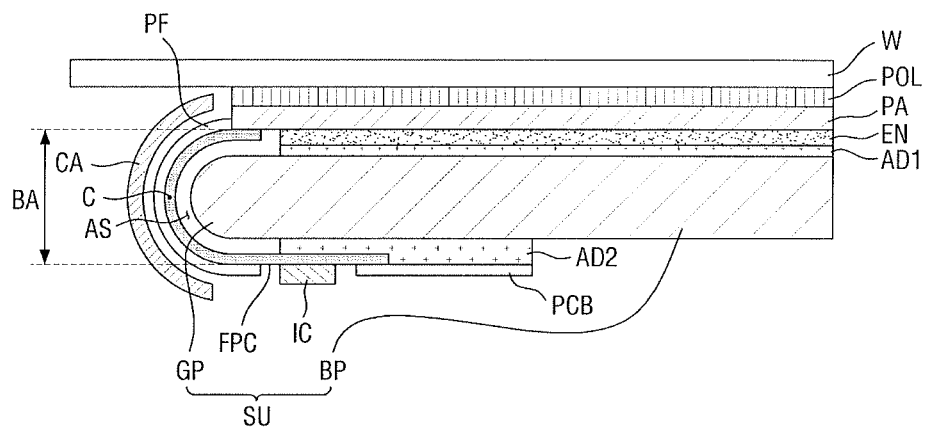
FIG. 1 illustrates a cross-sectional view of a display device according to an embodiment of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

The term "on" that is used to designate that an element is on another element or located on a different layer or a layer includes both a case where an element is located directly on another element or a layer and a case where an element is located on another element via another layer or still another element.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Figure 2:
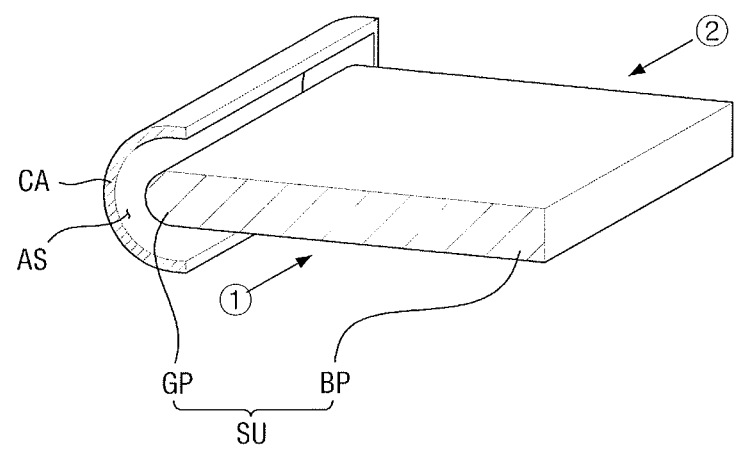
FIG. 2 illustrates a partial perspective view of a display device according to an embodiment of the present disclosure.
Figure 3:
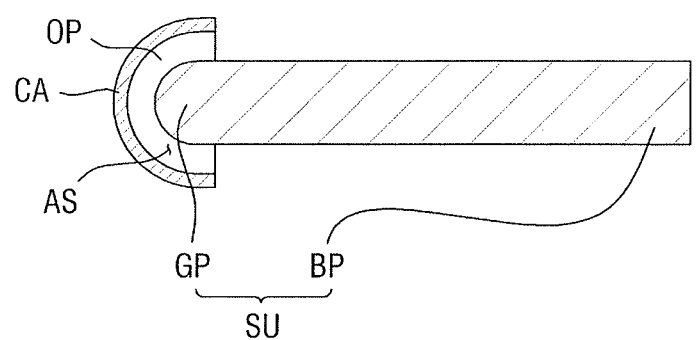
FIG. 3 illustrates a side view of a display device according to an embodiment of the present disclosure.
Figure 4:
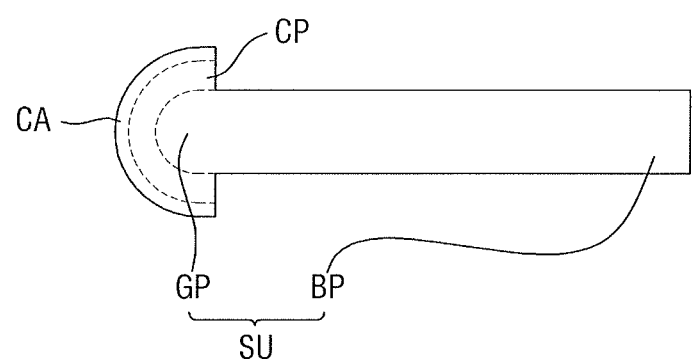
FIG. 4 illustrates a side view of a display device according to an embodiment of the present disclosure.

FIG. 1 illustrates a cross-sectional view of a display device according to an embodiment of the present disclosure. FIG. 2 illustrates a partial perspective view of a display device according to an embodiment of the present disclosure. FIGS. 3 and 4 illustrate side views of a display device according to an embodiment of the present disclosure.

Referring to FIGS. 1 and 4, a display device according to an embodiment of the present disclosure may include a support panel SU including a body part or body BP and a guide part or guide GP (e.g., on one side of the body BP), a protective cap CA spaced apart from the guide GP at one side of the support panel SU, a first substrate PA on the support panel SU, and a flexible printed circuit board FPC on one side of the first substrate PA.

The support panel SU may have a plate shape and may provide a space where the first substrate PA to be described later is seated.

In an implementation, the support panel SU may be made of, e.g., plastic or rubber. In an implementation, the support panel SU may be made of, e.g., a mixture of plastic and rubber, or may include other polymer materials.

In an implementation, the support panel SU may be made of a material having elasticity. If the support panel SU is formed of a material having elasticity, the shock absorbing performance of the support panel SU may be improved.

The support panel SU may include the body BP (having a plate shape) and the guide GP (on one side of the body BP).

The guide GP may protrude from or at one side of the body BP. For example, the guide GP may include a protruding curved surface that protrudes from or at one side of the body BP. Accordingly, an outer periphery of the cross section of the guide GP may include a curved line.

In an implementation, the outer periphery of the cross section of the guide GP may have a parabolic shape lying laterally, e.g., may have a "C" shape. For example, the guide GP may have a gentle curved surface to guide the flexible printed circuit board FPC such that the flexible printed circuit board FPC (described in greater detail below) can be disposed or accommodated stably. A detailed explanation will be given below.

In an implementation, the guide GP and the body BP may be integrally formed (e.g., as a monolithic or one-piece structure). For example, the guide GP and the body BP may be made of the same material. In an implementation, the guide GP and the body BP may be formed of different materials and may be formed independently of each other.

A first adhesive layer AD1 may be disposed on the support panel SU. The first adhesive layer AD1 may at least partially cover the body BP of the support panel SU. For example, the first adhesive layer AD1 may partially or entirely cover the body BP.

In an implementation, the first adhesive layer AD1 may include a photocurable resin or thermosetting resin having high transmittance and adhesive performance. For example, the first adhesive layer AD1 may be formed by applying a resin such as an acrylic resin and then curing the resin by irradiating ultraviolet rays (UV). In an implementation, the first adhesive layer AD1 may include an optically clear adhesive (OCA).

A second substrate EN may be disposed on the first adhesive layer AD1. In an implementation, the second substrate EN may be an encapsulating substrate or an encapsulating film of an organic light emitting display device. In an implementation, the display device may be an organic light emitting display device.

The first substrate PA may be disposed on the second substrate EN. In a case where the display device according to an embodiment is an organic light emitting display device, the first substrate PA may be a TFT substrate on which a plurality of organic light emitting layers and a plurality of thin film transistors are disposed.

The first substrate PA and the second substrate EN may be for suitable organic light emitting display devices, and therefore, a detailed description thereof may be omitted herein.

In an implementation, as illustrated in FIG. 1, the first substrate PA may be disposed on the second substrate EN. In an implementation, the stacking order may vary depending on the light emitting direction. In an implementation, the second substrate EN may be disposed on the first substrate PA (e.g., the first substrate PA may be between the support panel SU and the second substrate EN.

In an implementation, the display device may be, e.g., an organic light emitting display device.

In an implementation, the display device may be, e.g., a liquid crystal display device. In this case, a liquid crystal layer may be disposed between the first substrate PA and the second substrate EN. In an implementation, the order of stacking the first substrate PA and the second substrate EN may be changed as described above.

The flexible printed circuit board FPC may be disposed on one side of the first substrate PA. In an implementation, the flexible printed circuit board FPC may be made of a thin film material. Accordingly, the flexible printed circuit board FPC may be bent or bendable. For example, a bending area BA may be formed on or at the flexible printed circuit board FPC. In an implementation, the bending area BA may be defined as a non-zero curvature area in or of the flexible printed circuit board FPC. In an implementation, when the flexible printed circuit board FPC is bent, one end of the flexible printed circuit board FPC may be in contact with one end of the first substrate PA, and another end of the flexible printed circuit board FPC may be disposed below (e.g., spaced apart from and/or facing) the first substrate PA.

A driving chip IC may be disposed on the flexible printed circuit board FPC. In an implementation, the driving chip IC may be a data driving integrated circuit. For example, the driving chip IC may be a data driver that receives a data driving control signal and generates a data driving signal.

For example, the display device according to an embodiment of the present disclosure may be a chip on film (COF) type display device in which the driving chip IC is formed on the flexible printed circuit board FPC.

In an implementation, a printed circuit board PCB may be disposed on the other end of the flexible printed circuit board FPC. The printed circuit board PCB may function as an external driving circuit and may be electrically connected to the flexible printed circuit board FPC. To this end, the printed circuit board PCB may include a driving circuit generating a driving signal for driving the display device or transmitting the generated driving signal. In an implementation, the printed circuit board PCB may generate a driving control signal controlling the driving chip IC disposed on the flexible printed circuit board FPC. For example, the driving chip IC may generate a driving signal based on the driving control signal transmitted from the printed circuit board PCB and provide it to the display device.

In an implementation, a second adhesive layer AD2 may be disposed between the other end of the flexible printed circuit board FPC and the support panel SU. The second adhesive layer AD2 may fix the flexible printed circuit board FPC and/or the printed circuit board PCB to the lower surface of the support panel SU. In this case, by fixing the other end of the flexible printed circuit board FPC, the bent state of the flexible printed circuit board FPC may be stably maintained.

The second adhesive layer AD2 may be disposed at least partially on the lower surface of the support panel SU. For example, the second adhesive layer AD2 may be formed partially or entirely on the lower surface of the support panel SU.

In an implementation, as illustrated in FIG. 1, the second adhesive layer AD2 may be partially formed.

In an implementation, a protective film PF may be disposed on an outside or outer side of the bending area BA of the flexible printed circuit board FPC. The bending area BA of the flexible printed circuit board FPC may be vulnerable to an external impact due to stress generated in the bent state. The protective film PF on the outside of the flexible printed circuit board FPC may help alleviate or otherwise compensate for an external impact, thereby preventing the bending area BA of the flexible printed circuit board FPC from being damaged.

In an implementation, as illustrated in FIG. 1, the protective film PF may be disposed on the outside of the flexible printed circuit board FPC. In an implementation, the protective film PF may be disposed on an inside or interior side of the flexible printed circuit board FPC, or may be disposed on both the inside and outside of the flexible printed circuit board FPC.

The protective cap CA may be disposed at one side of the support panel SU. The protective cap CA may face the guide GP of the support panel SU. For example, the protective cap CA may be spaced apart from the guide GP and may face the guide GP.

The protective cap CA may include an inwardly curved (e.g., concave) surface. For example, the protective cap CA may have a curved surface that is recessed inwardly to correspond to the protruding curved (e.g., convex) surface of the guide GP. For example, the protective cap CA may have a concave structure that is roughly complementary to the convex structure of the guide GP.

When the protective cap CA and the guide GP are disposed to be spaced apart from each other by a predetermined distance, a separation space (hereinafter, referred to as "accommodation space AS") may be formed between the protective cap CA and the guide GP. A cross-section of the accommodation space AS may have a laterally lying "U" shape (e.g., a "C" shape). This may be a shape corresponding to the shape of the bending area BA of the flexible printed circuit board FPC described above.

This will be described in more detail with reference to FIGS. 2 to 4.

Referring to FIG. 2, the accommodation space AS may extend in a longitudinal direction along the guide GP. FIG. 3 illustrates a side view seen from direction ① of FIG. 2, and FIG. 4 illustrates a side view seen from direction ② of FIG. 2. Referring to FIGS. 3 and 4, an opening part or open end OP may be at one side or end of the accommodation space AS and a closing part or closed end CP may be at another side or end of the accommodation space AS. The closed end CP may be formed (e.g., the accommodation space AS may be closed off) by connecting the protective cap CA and the guide GP. For example, a side wall connecting the protection cap CA and the guide GP may be formed at the other side or end of the accommodation space AS.

For example, the protective cap CA and the guide GP may be connected to each other by the side wall. Accordingly, the protective cap CA and the guide GP are separated from each other in the remaining portion (e.g., except for or other than the portion where the side wall is formed), so that the accommodation space AS can be formed (e.g., with the open end OP).

The open end OP may be formed at one side of the accommodation space AS. The accommodation space AS may be connected to or in communication with an external space by the open end OP.

As will be described in detail below, the flexible printed circuit board FPC may be accommodated in the accommodation space AS through the open end OP.

Referring back to FIG. 1, the flexible printed circuit board FPC may be accommodated in the accommodation space AS. As described above, the flexible printed circuit board FPC may be vulnerable to an external impact, and the flexible printed circuit board FPC may have minimal contact with the protective cap CA or the guide GP while being accommodated in the accommodation space AS.

For example, the bending area BA of the flexible printed circuit board FPC may maintain its shape by the elasticity of the material itself, and the accommodation space AS may accommodate the bending area BA of the flexible printed circuit board FPC so as to minimize contact therebetween, which may be advantageous in terms of durability.

To this end, a central portion C of the bending area BA of the flexible printed circuit board FPC may not be in contact with the guide GP. For example, the central portion C may be spaced apart from the guide GP. In addition, the central portion C of the bending area BA of the flexible printed circuit board FPC may also be spaced apart from the protective cap CA.

For example, the central portion C of the bending area BA may not be in contact with the guide GP and may not be in contact with the protective cap CA. When the central portion C of the bending area BA is not in contact with the guide GP and the protective cap CA, contact of the remaining portion of the bending area BA with the guide GP and the protective cap CA may be minimized. Accordingly, it is possible to help minimize the external impact transmitted to the flexible printed circuit board FPC through the guide GP and/or the protective cap CA.

In an implementation, a polarizing plate POL may be disposed on the first substrate PA. In an embodiment in which the display device is an organic light emitting display device, the polarizing plate POL may be a circularly polarizing plate. For example, the polarizing plate POL may include a λ/4 phase retardation plate to help block or reflect light incident externally.

In an embodiment in which the display device is an organic light emitting display device, the polarizing plate POL may be omitted.

In an embodiment in which the display device is a liquid crystal display device, the polarizing plate POL may be a linearly polarizing plate that transmits light oscillating in one direction.

A window W may be disposed on the polarizing plate POL. The window W may be formed of a transparent material that transmits light. The window may include, e.g., glass or transparent plastic.

In an implementation, as illustrated in FIG. 1, the window W may include a single layer. In an implementation, the window W may have a stacked structure in which a plurality of functional layers are stacked. The plurality of functional layers may include an adhesive layer or a bonding layer.

In an implementation, the window W may have flexible properties. For example, the window W may be formed of a bendable, foldable, rollable material or structure, and may be bent, folded, or rolled.

In an implementation, the window W may have rigid properties. In this case, the window W may maintain an original shape as it is.

Hereinafter, a display device according to another embodiment of the present disclosure will be described. In the following embodiment, the same components as those described above are denoted by the same reference numerals, and a repeated description thereof may be omitted or simplified.

Figure 5:
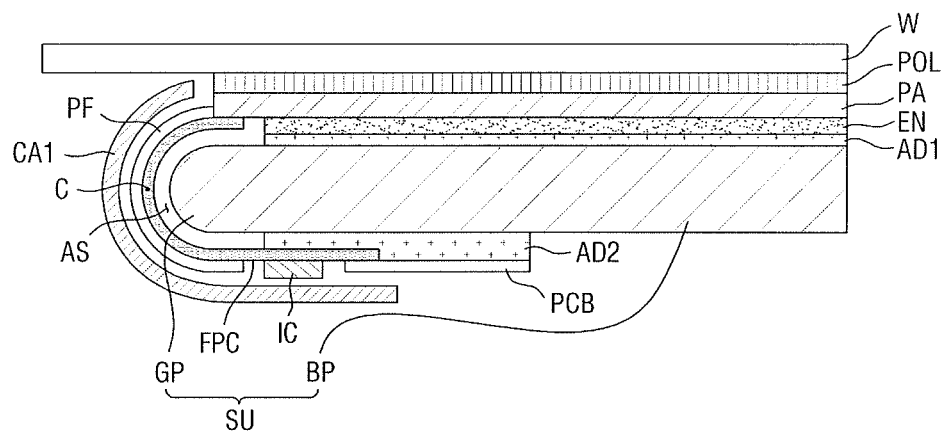
FIG. 5 illustrates a cross-sectional view of a display device according to another embodiment of the present disclosure.

FIG. 5 illustrates a cross-sectional view of a display device according to another embodiment of the present disclosure. Referring to FIG. 5, the present embodiment is different from the embodiment of FIG. 1 in that a lower end of a protective cap CA1 may extend to a lower portion of the body BP of the support panel SU.

In an implementation, the lower end (e.g., end distal to the first substrate PA) of the protective cap CA1 may extend to the inside of the display device.

For example, the protective cap CA1 can completely cover the driving chip IC.

In an implementation, the protective cap CA1 may extend to at least partially cover the flexible printed circuit board FPC.

In an implementation, the protective cap CA1 may extend to at least partially cover the printed circuit board PCB. For example, the protective cap CA1 may extend to partially or completely cover the printed circuit board PCB. In an implementation, as illustrated in FIG. 5, the protective cap CA1 may partially cover the printed circuit board PCB.

When the lower end of the protective cap CA1 is extended as in the embodiment of FIG. 5, it is possible to help prevent the driving chip IC, the flexible printed circuit board FPC, and the printed circuit board PCB from being exposed to an external impact.

Figure 6:
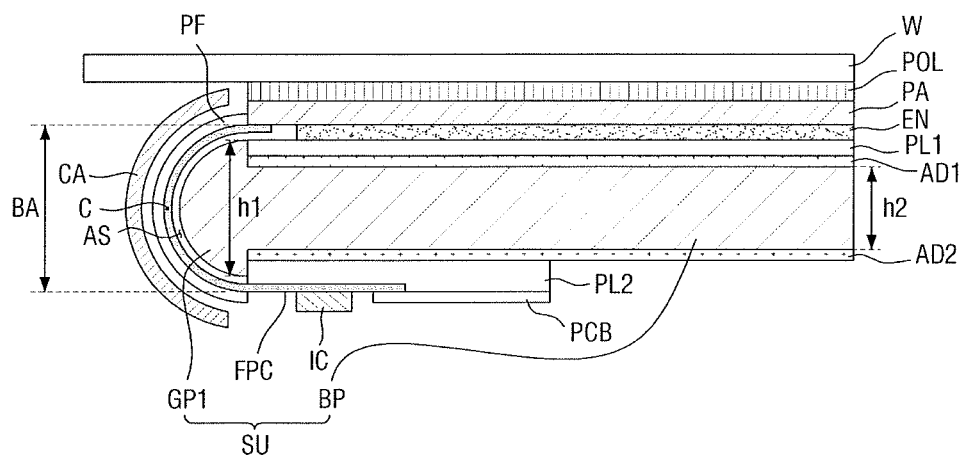
FIG. 6 illustrates a cross-sectional view of a display device according to yet another embodiment of the present disclosure.

FIG. 6 illustrates a cross-sectional view of a display device according to yet another embodiment of the present disclosure. Referring to FIG. 6, the present embodiment is different from the embodiment of FIG. 1 in that the thickness of the guide GP is greater than the thickness of the body BP.

In an implementation, the thickness of the guide GP may be greater than the thickness of the body BP (e.g., when measured in a same direction). As used herein, the term "thickness" may mean the maximum thickness of a component. As shown in FIG. 6, the guide GP may have a first thickness h1 and the body BP may have a second thickness h2. In an implementation, the first thickness h1 may be greater than the second thickness h2.

When the thickness of the guide GP is greater than that of the body BP, a height difference may be formed in the support panel SU. In order to eliminate the height difference, protective layers PL1 and PL2 may be formed on an upper surface and/or a lower surface of the body BP. For convenience of explanation, the protective layer on the upper surface of the body BP may be referred to as a first protective layer PL1, and the protective layer on the lower surface of the body BP may be referred to as a second protective layer PL2.

The first protective layer PL1 and the second protective layer PL2 may compensate for the height difference. In an implementation, the first protective layer PL1 and the second protective layer PL2 may help mitigate or buffer impact. In an implementation, the first protective layer PL1 and/or the second protective layer PL2 may include a polymer resin.

In an implementation, as illustrated in FIG. 6, the first adhesive layer AD1 may be interposed between the first protective layer PL1 and the body BP and the second adhesive layer AD2 is interposed between the second protective layer PL2 and the body BP.

In an implementation, the first protective layer PL1 may be disposed between the first adhesive layer AD1 and the body BP, and the second protective layer PL2 may be disposed between the second adhesive layer AD2 and the body BP.

In an implementation, the first protective layer PL1 and the second protective layer PL2 may be omitted. For example, the height difference may be compensated for by forming the first adhesive layer AD1 and the second adhesive layer AD2 to be relatively thick.

In an implementation, the first adhesive layer AD1 and the second adhesive layer AD2 may be omitted. For example, the height difference compensation may be performed by the first protective layer PL1 and the second protective layer PL2.

Figure 7:
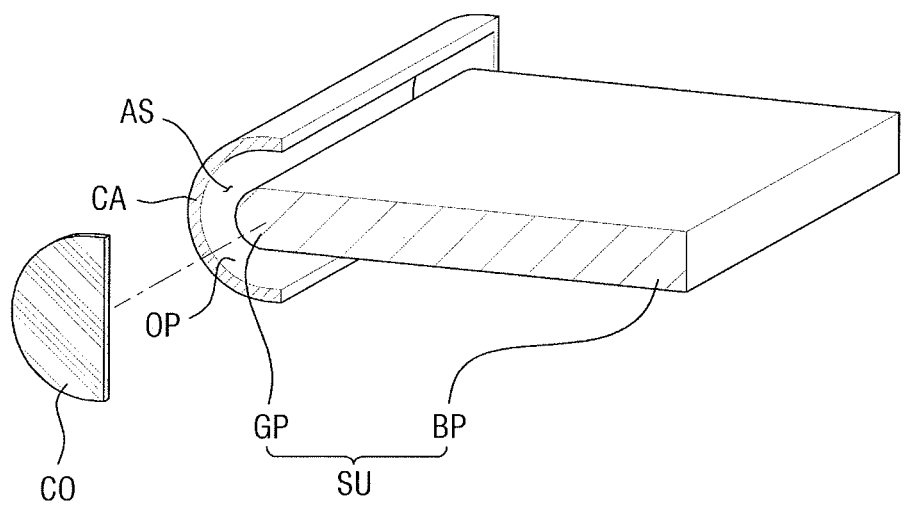
FIG. 7 illustrates a partial perspective view of a display device according to still another embodiment of the present disclosure.

FIG. 7 illustrates a partial perspective view of a display device according to still another embodiment of the present disclosure. Referring to FIG. 7, the present embodiment is different from the embodiment of FIG. 3 in that the display device may include a cover CO that covers the open end OP of the accommodation space AS. As described above with reference to FIGS. 3 and 4, the open end OP may be disposed at one side or end of the accommodation space AS and the closed end CP may be disposed at the other side or end of the accommodation space AS.

The cover CO may cover the open end OP of the accommodation space AS while the flexible printed circuit board FPC is accommodated in the accommodation space AS. When the cover CO covers the open end OP while the flexible printed circuit board FPC is accommodated in the accommodation space AS, it is possible to help prevent external contaminants and the like from entering the accommodation space AS.

Figure 8:
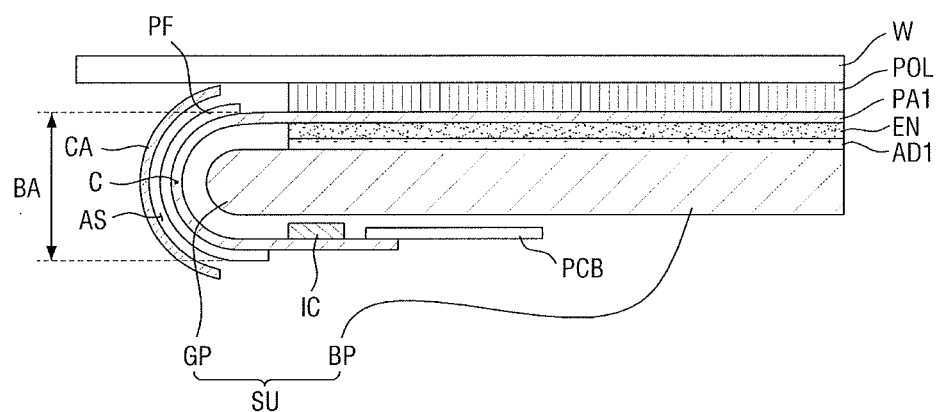
FIG. 8 illustrates a cross-sectional view of a display device according to still another embodiment of the present disclosure.

FIG. 8 illustrates a cross-sectional view of a display device according to still another embodiment of the present disclosure. Referring to FIG. 8, the present embodiment is different from the embodiment of FIG. 1 in that the flexible printed circuit board FPC is omitted and the bending area BA is formed on or at the first substrate PA1.

In an implementation, the bending area BA may be formed on or at one side or part of the first substrate PA1. In an implementation, one side of the first substrate PA1 may be bent toward the inside of the first substrate PA1, e.g., toward a display region.

For example, the flexible printed circuit board FPC may be omitted. In an implementation, the driving chip IC may be directly mounted on one surface of the first substrate PA1. In an implementation, the display device may be a chip on panel (COP) type display device in which the driving chip IC is directly mounted on a display panel.

The display device according to the present embodiment may have substantially the same configuration as the above-described display device according to some embodiments of the present disclosure, except that the flexible printed circuit board FPC is omitted and the first substrate PA1 itself is bent. Therefore, a redundant description thereof may be omitted.

Hereinafter, a method of manufacturing a display device according to an embodiment of the present disclosure will be described. In the following embodiment, the same components as those described above are denoted by the same reference numerals, and a repeated description may be omitted or simplified.

A method of manufacturing a display device according to an embodiment of the present disclosure may include a step of preparing or providing the support panel SU (including the body BP and the guide GP at on one side of the body BP), and providing the protective cap CA to face the guide GP at one side of the support panel SU, and a step of seating the first substrate PA (having the flexible printed circuit board FPC) on one side thereof on the support panel SU. The step of seating the first substrate PA on the support panel SU may include a step of inserting the bent flexible printed circuit board FPC into the accommodation space AS between the guide GP and the protective cap CA.

First, a step of preparing or providing the support panel SU including the body BP and the guide GP (on one side of the body BP) may be performed and providing the protective cap CA to face the guide GP at one side of the support panel SU may be performed.

The support panel SU and the protective cap CA may be substantially the same as those of the above-described display device according to some embodiments of the present disclosure.

Then, a step of seating the first substrate PA, on which the flexible printed circuit board FPC is formed at one end thereof, on the support panel SU may be performed. The step of seating the first substrate PA on the support panel SU may include a step of inserting the flexible printed circuit board FPC in a bent state into the accommodation space AS.

The step of inserting the flexible printed circuit board FPC in a bent state into the accommodation space AS will be described with reference to FIG. 9.

Figure 9:
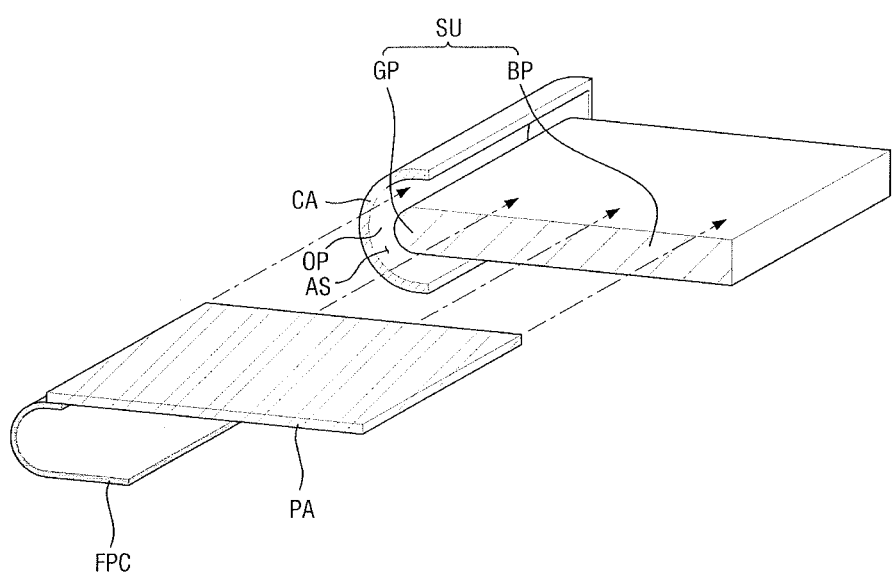
FIG. 9 illustrates a partial perspective view illustrating a method of manufacturing a display device according to an embodiment of the present disclosure.

FIG. 9 illustrates a partial perspective view of a method of manufacturing a display device according to an embodiment of the present disclosure.

Referring to FIG. 9, the flexible printed circuit board FPC in a bent state may be inserted into the open end OP of the accommodation space AS. For example, the bending area BA of the flexible printed circuit board FPC may be inserted into the accommodation space AS.

The flexible printed circuit board FPC (which has been partially inserted) may then be completely inserted by being slid along the accommodation space AS, so that the first substrate PA may be seated on the support panel SU.

In an implementation, the flexible printed circuit board FPC may be omitted and the first substrate PA itself may be bent. In this case, the bending area BA of the first substrate PA in a bent state may be inserted into the accommodation space AS. The bending area BA may be inserted into the accommodation space AS in substantially the same manner in which the flexible printed circuit board FPC is inserted as described above.

In an implementation, the method of manufacturing a display device according to an embodiment of the present disclosure may further include a step of forming the first adhesive layer AD1 and/or the second adhesive layer AD2, a step of disposing the second substrate EN facing the first substrate PA, a step of forming the polarizing plate POL, a step of forming the window W, a step of forming the driving chip IC, and/or a step of forming the printed circuit board PCB.

The first adhesive layer AD1, the second adhesive layer AD2, the second substrate EN, the polarizing plate POL, the window W, the driving chip IC, and the printed circuit board PCB may be substantially the same as those of the above-described display device according to some embodiments of the present disclosure. For example, the forming method is not limited within the scope not departing from the above description.

The step of forming the first adhesive layer AD1 and/or the second adhesive layer AD2, the step of disposing the second substrate EN facing the first substrate PA, the step of forming the polarizing plate POL, the step of forming the window W, the step of forming the driving chip IC, and/or the step of forming the printed circuit board PCB may be performed, without limiting their order, before, after or between the steps of the method of manufacturing a display device according to an embodiment of the present disclosure.

By way of summation and review, in order to support various functions, the mobile electronic device may include a display device to provide visual information such as an image to a user. As components for driving the display device become smaller, the display device may occupy a larger proportion of the electronic device. To this end, a structure in which a part of the display device may be bent to have a predetermined angle from a planar state may be considered.

The embodiments may provide a display device capable of realizing a narrow bezel.

The embodiments may provide a display device capable of realizing a narrow bezel while ensuing sufficient durability.

According to an embodiment, it is possible to help prevent an external impact from being applied to a portion of the display device.

By protecting a portion of the display device, which is vulnerable to an impact, the durability of the display device according to an embodiment may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A display device, comprising:
   a support panel including a body and a guide, the guide being on one side of the body;
   a protective cap spaced apart from the guide at one side of the support panel;
   a first substrate on the support panel;
   a flexible printed circuit board on one side of the first substrate; and
   a driving chip on the flexible printed circuit board, wherein:
   an accommodation space is defined between the protective cap and the guide,
   the flexible printed circuit board is accommodated in the accommodation space,
   the flexible printed circuit board includes a bending area that is bent,
   the bending area is accommodated in the accommodation space
   the guide includes a protruding curved surface,
   the protective cap includes a recessed curved surface corresponding to the protruding curved surface of the guide such that the protruding curved surface of the guide is in the accommodation space, and
   a central portion of the bending area is between and spaced apart from the protective cap and the guide,
   wherein the driving chip overlaps the body of the support panel,
   wherein the driving chip does not overlap any portion of the protective cap,
   wherein one end of the accommodation space is open and another end of the accommodation space is a closed by a side wall, and
   wherein the side wall is connected to the protective cap and the support panel.

2. The display device as claimed in claim 1, wherein a cross-section of the accommodation space has a laterally lying "U" shape.

3. The display device as claimed in claim 1, further comprising a protective film on an outside of the flexible printed circuit board.

4. The display device as claimed in claim 1, further comprising a cover that covers the open end of the accommodation space.

5. The display device as claimed in claim 1, wherein a thickness of the guide is greater than a thickness of the body.

6. The display device as claimed in claim 1, wherein the recessed curved surface of the protective cap faces the protruding curved surface of the guide.

7. A display device, comprising:
   a support panel including a body and a guide, the guide being on one side of the body;
   a protective cap spaced apart from the guide at one side of the support panel;
   a first substrate on the support panel, the first substrate including a bending area that is bent at one side; and
   a driving chip on the first substrate,
   wherein:
   an accommodation space is defined between the protective cap and the guide,
   the bending area is accommodated in the accommodation space,
   the guide includes a protruding curved surface,
   the protective cap includes a recessed curved surface corresponding to the protruding curved surface of the guide such that the protruding curved surface of the guide is in the accommodation space, and
   a central portion of the bending area is between and spaced apart from the protective cap and the guide,
   wherein the driving chip overlaps the body of the support panel,
   wherein the driving chip does not overlap any portion of the protective cap,
   wherein one end of the accommodation space is open and another end of the accommodation space is a closed by a side wall, and
   wherein the side wall is connected to the protective cap and the support panel.

8. The display device as claimed in claim 7, wherein a thickness of the guide is greater than a thickness of the body.

* * * * *